United States Patent
Nondhasitthichai et al.

(10) Patent No.: US 9,773,722 B1
(45) Date of Patent: Sep. 26, 2017

(54) SEMICONDUCTOR PACKAGE WITH PARTIAL PLATING ON CONTACT SIDE SURFACES

(71) Applicant: UTAC Headquarters PTE, LTD., Singapore (SG)

(72) Inventors: Somchai Nondhasitthichai, Bangkok (TH); Saravuth Sirinorakul, Bangkok (TH); Woraya Benjavasukul, Bangkok (TH)

(73) Assignee: UTAC HEADQUARTERS PTE. LTD., Singapore (SG)

( * ) Notice: Subject to any disclaimer, the term of this patent is extended or adjusted under 35 U.S.C. 154(b) by 0 days.

(21) Appl. No.: 14/706,864

(22) Filed: May 7, 2015

Related U.S. Application Data

(60) Provisional application No. 61/990,040, filed on May 7, 2014, provisional application No. 62/126,262, filed on Feb. 27, 2015.

(51) Int. Cl.
*H01L 23/495* (2006.01)
*H01L 23/31* (2006.01)

(52) U.S. Cl.
CPC .... *H01L 23/49582* (2013.01); *H01L 23/3107* (2013.01); *H01L 23/4952* (2013.01); *H01L 23/49524* (2013.01)

(58) Field of Classification Search
CPC ............. H01L 23/3107; H01L 23/4952; H01L 23/49524; H01L 23/49582
See application file for complete search history.

(56) References Cited

U.S. PATENT DOCUMENTS

| | | | |
|---|---|---|---|
| 6,660,626 B1 | 12/2003 | Lin | |
| 6,969,638 B2 | 11/2005 | Estepa et al. | |
| 7,320,937 B1 | 1/2008 | Pal et al. | |
| 8,084,299 B2 * | 12/2011 | Tan | H01L 21/4832 257/666 |
| 2002/0130400 A1 * | 9/2002 | Jeong | H01L 21/565 257/670 |

(Continued)

OTHER PUBLICATIONS

Final Office Action mailed on Nov. 29, 2016, U.S. Appl. No. 15/042,050, filed Feb. 11, 2016, Somchai Nondhasitthichai et al., 55 pages.

(Continued)

*Primary Examiner* — Daniel Luke
*Assistant Examiner* — Khatib Rahman
(74) *Attorney, Agent, or Firm* — Haverstock & Owens LLP

(57) ABSTRACT

Embodiments of the present invention are directed to a semiconductor package with partial plating on contact surfaces. The semiconductor package includes a top surface, a bottom surface that is opposite the top surface, and side surfaces between the top surface and the bottom surface. Each of the side surfaces includes a step such that the area of the bottom surface is smaller than the area of the top surface. The semiconductor package includes a plurality of contacts that is located at peripheral edges of the bottom surface. Each of the plurality of contacts includes a first surface that is flush with the bottom surface, a second surface that is flush with one of the side surfaces, and a curved surface located at a corresponding step. In some embodiments, the first surface and the curved surface are plated, while the second surface is exposed (not plated).

20 Claims, 16 Drawing Sheets

(56) References Cited

U.S. PATENT DOCUMENTS

2008/0246132 A1    10/2008  Kasuya et al.
2009/0026590 A1*    1/2009  Lim ..................... H01L 21/568
                                                        257/670
2011/0244629 A1*   10/2011  Gong .................. H01L 21/4828
                                                        438/112

OTHER PUBLICATIONS

Office Action dated Jun. 28, 2016, U.S. Appl. No. 15/042,050, filed Feb. 11, 2016, Somchai Nondhasitthichai et al.et al., 33 pages.

* cited by examiner

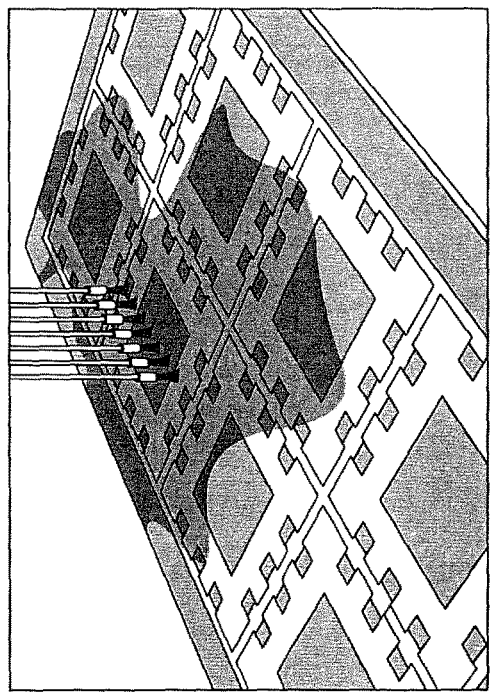
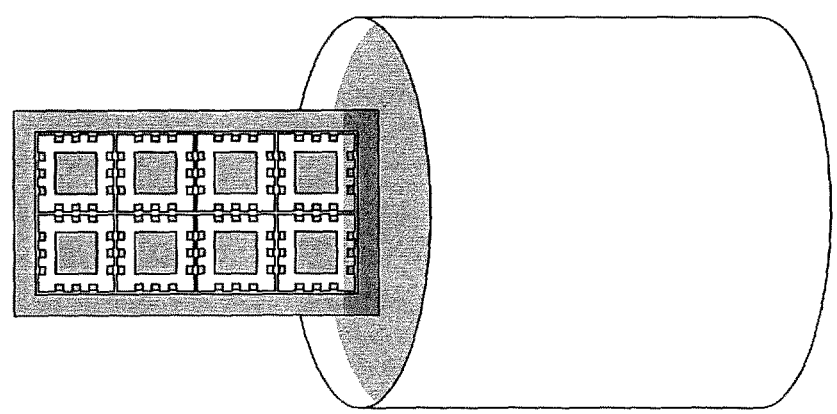
Fig. 4E

455  W 1 is width of chemical etching trace 465  460

US 9,773,722 B1

SEMICONDUCTOR PACKAGE WITH PARTIAL PLATING ON CONTACT SIDE SURFACES

RELATED APPLICATIONS

This application claims benefit of priority under 35 U.S.C. section 119(e) of the U.S. Provisional Patent Application Ser. No. 61/990,040, filed May 7, 2014, entitled "Semiconductor Package with Partial Plated on Side Terminals," which is hereby incorporated by reference in its entirety.

This application also claims benefit of priority under 35 U.S.C. section 119(e) of the U.S. Provisional Patent Application Ser. No. 62/126,262, filed Feb. 27, 2015, entitled "Semiconductor Package with Partial Plated on Side Terminals," which is hereby incorporated by reference in its entirety.

FIELD OF INVENTION

The present invention is related to the field of semiconductor package manufacturing. More specifically, the present invention relates to a semiconductor package with partial plating on contact side surfaces.

BACKGROUND OF THE INVENTION

A semiconductor device array contains individual integrated circuits or semiconductor packages. Contacts of the semiconductor packages are exposed at the bottom of the semiconductor array. The contacts are typically made of copper. To prevent oxidation on the copper surface, the contacts are plated with a lead finished material, such as matte tin (Sn), using electroplating. As a result, the bottom surfaces of the contacts are thereafter tin plated.

Singulation is a process of separating each semiconductor package from a molded sheet. Dicing or sawing is a process that singulates the semiconductor array into individual or singulated semiconductor packages. Conventionally, the electroplated semiconductor array is diced into singulated semiconductor packages to be shipped to customers for assembly onto printed circuit boards. The singulation of the semiconductor packages result in contacts on peripheral edges of the singulated semiconductor packages.

FIG. 1 illustrates a singulated semiconductor package 100 having a plurality of contacts 105 on peripheral edges of the singulated semiconductor package. Although the bottoms of the contacts 105*a* are tin plated, sidewalls 105*b* of the contacts 105*b* are exposed (e.g., without tin plating), because the singulation occurred after the semiconductor array was electroplated with the lead finished material. If the singulated semiconductor package 100 is stored in inappropriate environments and/or conditions (e.g., moisture in the air, acids, bases, salts, oils, aggressive metal polished, and other solid and liquid chemicals) after singulation, then the exposed surfaces 105*b* become sites for potential corrosion 110 such as copper oxide. This aging process is known as oxidation. The exposed surfaces 105*b*, usually deposited with pollutant layers of oxide and other nonmetallic compound 110, often interfere with or inhibit solder wettability. The resulting oxide layer reduces solderability because contamination 110 prevents the metal from soldering well. The rate of oxidation can increase with an increase in temperature or humidity. Solder problems are a common cause for device failures.

A perfectly clean surface is required for assembly of the singulated semiconductor packages 100 onto a substrate, such as a printed circuit board. Since metal oxides form a barrier that prevents molten solder from forming a true metallurgical bond, the metal oxides must be limited.

BRIEF SUMMARY OF THE INVENTION

Embodiments of the present invention are directed to a semiconductor package with partial plating on contact surfaces. The semiconductor package includes a top surface, a bottom surface that is opposite the top surface, and side surfaces between the top surface and the bottom surface. Each of the side surfaces includes a step such that the area of the bottom surface is smaller than the area of the top surface. The semiconductor package includes a plurality of contacts that is located at peripheral edges of the bottom surface. Each of the plurality of contacts includes a first surface that is flush with the bottom surface, a second surface that is flush with one of the side surfaces, and a curved surface located at a corresponding step. In some embodiments, the first surface and the curved surface are plated, while the second surface is exposed (not plated).

In one aspect, a semiconductor package is provided. The semiconductor package includes a semiconductor die, a formed leadframe having a plurality of contacts, each including an interfacing surface at a bottom of the semiconductor package, an interior surface that is opposite the interfacing surface, a step at a non-exposed end that is positioned near the semiconductor die and a curved corner at an exposed end that is opposite the non-exposed end, such that the area of the interfacing surface is smaller than the area of the interior surface, and a molding compound encapsulating the semiconductor die and at least a portion of each of the plurality of contacts, wherein the molding compound includes a step, and wherein the curved corner of the contact is located at the step.

In some embodiments, at a back side of the semiconductor package, the exposed surface of the contact is plated.

In some embodiments, at the back side of the semiconductor package, a first portion of the exposed end is plated and a second portion of the exposed end is not plated. In some embodiments, the first portion is the curved corner of the contact.

In some embodiments, the formed leadframe further includes tie bars and die attach pad coupled with the tie bars.

In some embodiments, at the back side of the semiconductor package, the die attach pad is also plated.

In some embodiments, the semiconductor die is electrically coupled with the interior surface of the contact via wirebonds. Alternatively, the semiconductor die is electrically coupled with the interior surface of the contact via solder balls.

In some embodiments, the step continuously runs the full length of the an edge of the semiconductor package. Alternatively, the step discretely runs the full length of the an edge of the semiconductor package.

In another aspect, a semiconductor package is provided. The semiconductor package includes a plurality of contacts located around peripheral edges of the semiconductor package, wherein side surfaces of each of the plurality of contacts are partially plated, a semiconductor die electrically coupled with the plurality of contacts, and a molding compound encapsulating the semiconductor die and at least a portion of each of the plurality of contacts such that a first surface of a corresponding contact is flush with a bottom surface of the semiconductor package, a second surface of the corresponding contact is flush with a side surface of the semiconductor package, and a curved surface of the corresponding contact is located at a step of the side surface of the semiconductor package.

In some embodiments, the first surfaces and the curved surfaces of the plurality of contacts are plated but the second surfaces of the plurality of contacts are not plated.

In some embodiments, the area of the bottom surface of the semiconductor package is smaller than the area of a top surface of the semiconductor package.

In some embodiments, the semiconductor package further includes a die attach pad, wherein the molding compound encapsulates at least a portion of the die attach pad such that the die attach pad is exposed and flush with the bottom surface of the semiconductor package.

In some embodiments, the die attach pad exposed at the bottom surface of the semiconductor package is plated.

In some embodiments, the semiconductor package further includes another semiconductor die that is encapsulated in the molding compound.

In some embodiments, the step continuously runs the full length of the side surface of the semiconductor package. Alternatively, the step discretely runs the full length of the side surface of the semiconductor package.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

FIGS. 4A-4K illustrate an exemplary result produced at each step of the method of FIG. 3.

DETAILED DESCRIPTION OF THE INVENTION

In the following description, numerous details are set forth for purposes of explanation. However, one of ordinary skill in the art will realize that the invention can be practiced without the use of these specific details. Thus, the present invention is not intended to be limited to the embodiments shown but is to be accorded the widest scope consistent with the principles and features described herein.

Figure 1:
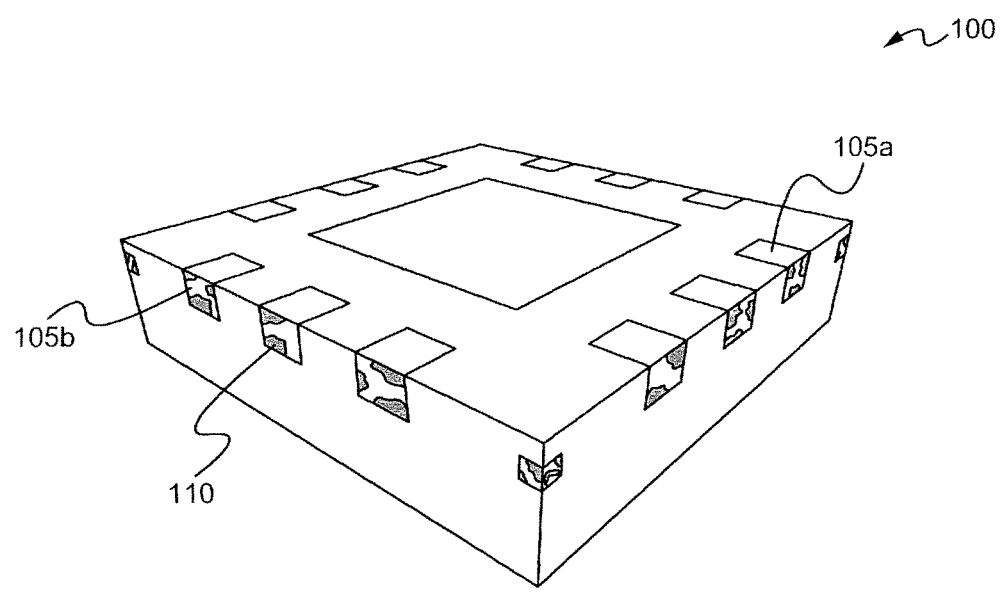
FIG. 1 illustrates a singulated semiconductor package having a plurality of contacts on peripheral edges of the singulated semiconductor package.
Figure 2:
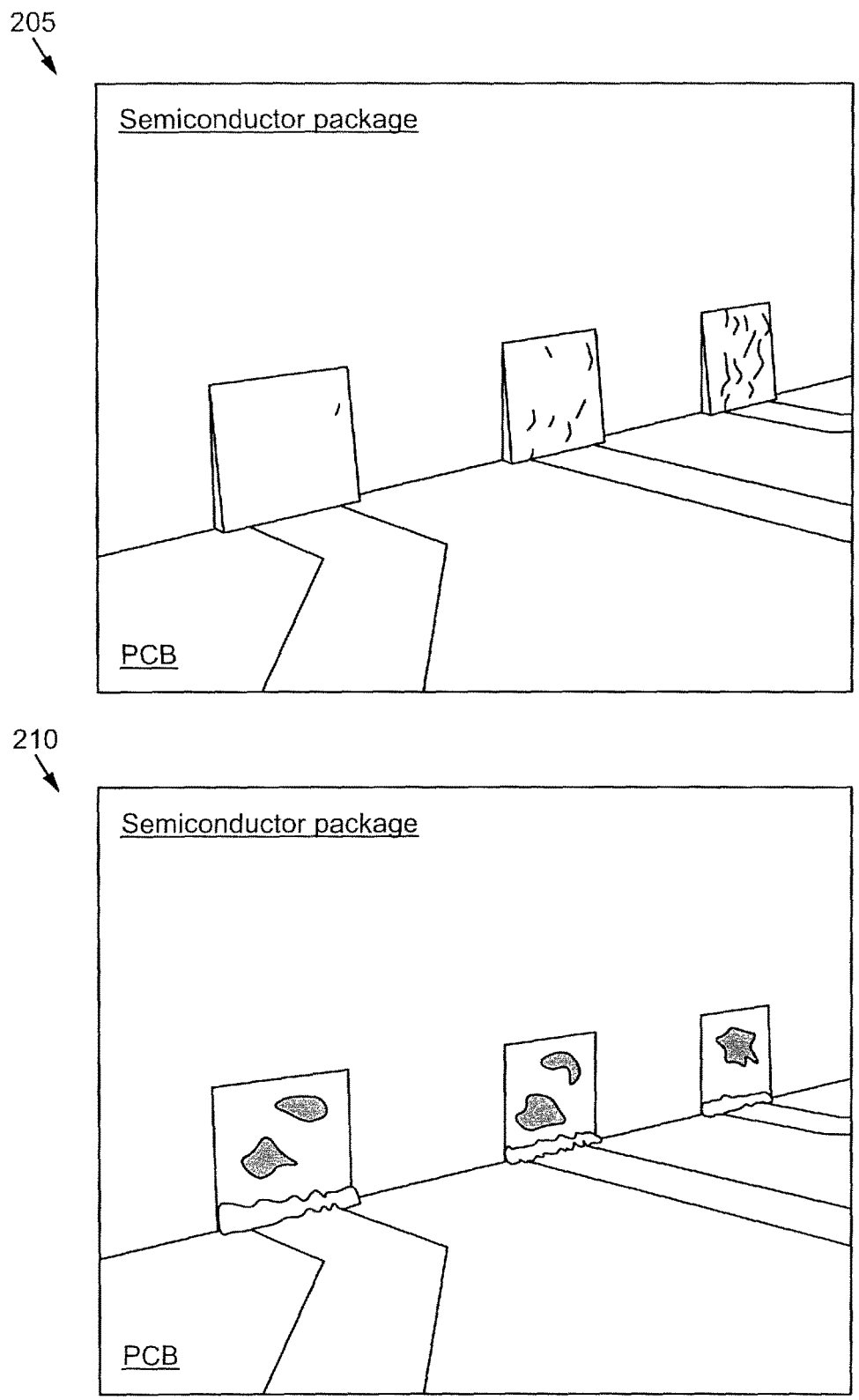
FIG. 2 illustrates two exemplary pictures, each of a package soldered on a PCB.

In a conventional semiconductor package, such as the semiconductor package 100 of FIG. 1, side surfaces of its contacts are not plated. When the semiconductor package is soldered to a substrate, such as a printed circuit board (PCB), an expected (such as complete) solder coverage on the side surfaces of the contacts of the semiconductor package is preferred since such coverage ensures the quality of the soldering to the PCB. If there is an unexpected defect (such as lack of) solder coverage on the side surfaces of the contacts of the semiconductor package, then there could be issues with the soldering. As discussed in the Background of the Invention section of the present application, metal oxide on the copper surfaces of the contacts prevents sufficient solder coverage on the copper surfaces during soldering. Plating metal, such as matted tin, on the copper surfaces can prevent the occurrence of metal oxide on the surfaces. The solder can "move" to cover the plated metal surfaces when the semiconductor package is being soldered to the PCB. FIG. 2 illustrates two exemplary pictures, each of a semiconductor package soldered on a PCB. The picture 205 on the left shows complete solder coverage on the side surfaces of the contacts, while the picture on the right 210 shows unexpected solder coverage on the side surfaces of the contacts. By visual inspection, complete solder coverage on the contacts can ensure quality of the soldering, while unexpected solder coverage on the contacts can lead to questions regarding quality of the soldering. However, plating the side surfaces of contacts requires an additional processing step as these side surfaces are exposed upon singulation of the semiconductor package from other semiconductor packages.

Embodiments of the present invention are directed to a semiconductor package with partial plating on contact side surfaces. The semiconductor package includes a top surface, a bottom surface that is opposite the top surface, and side surfaces between the top surface and the bottom surface. Each of the side surfaces includes a step such that the area of the bottom surface is smaller than the area of the top surface. The semiconductor package includes a plurality of contacts that is located on peripheral edges of the bottom surface. Each of the plurality of contacts includes a first surface that is flush with the bottom surface, a second surface that is flush with one of the side surfaces, and a curved surface located at a corresponding step. In some embodiments, the first surface and the curved surface are plated, while the second surface is exposed (not plated).

A contact of the semiconductor package of the present invention includes a first surface, a curved surface and a second surface. A side surface of the contact refers herein to the curved surface and the second surface of the contact. As discussed below, no additional processing step is required to partially plate contact side surfaces. The semiconductor package with partial plating on its contact side surfaces ensures quality of soldering of the semiconductor package to a substrate, such as a PCB, even if unplated areas of the contact side surfaces are contaminated. It should be noted that the terms "contact," "terminal," and "connector" are used interchangeably herein. It should also be noted that the "sidewalls" of a contact and the "side surfaces" of a contact are used interchangeably herein.

Figure 3:
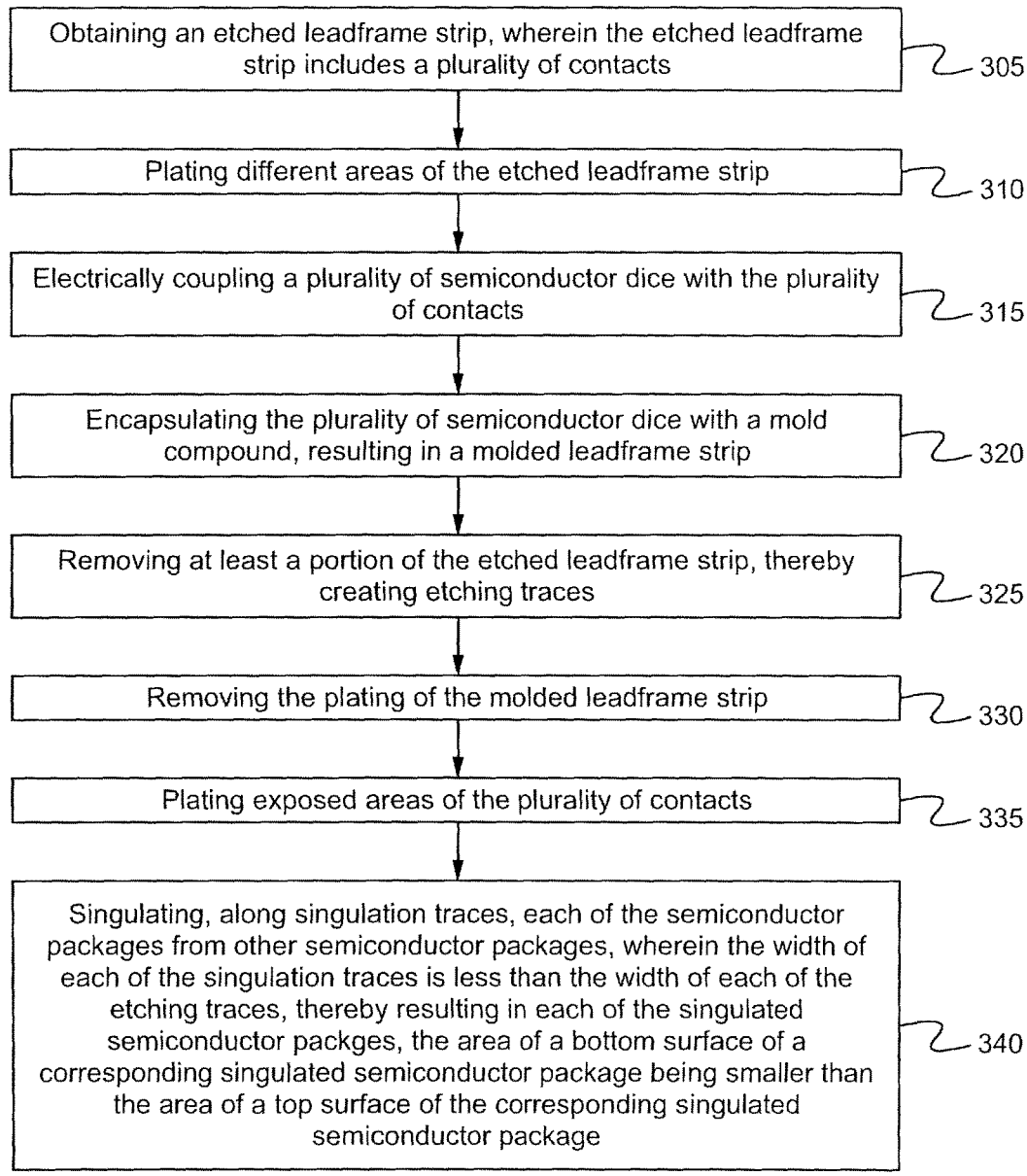
FIG. 3 illustrates an exemplary method of manufacturing semiconductor packages according to some embodiments.
Figure 4A:
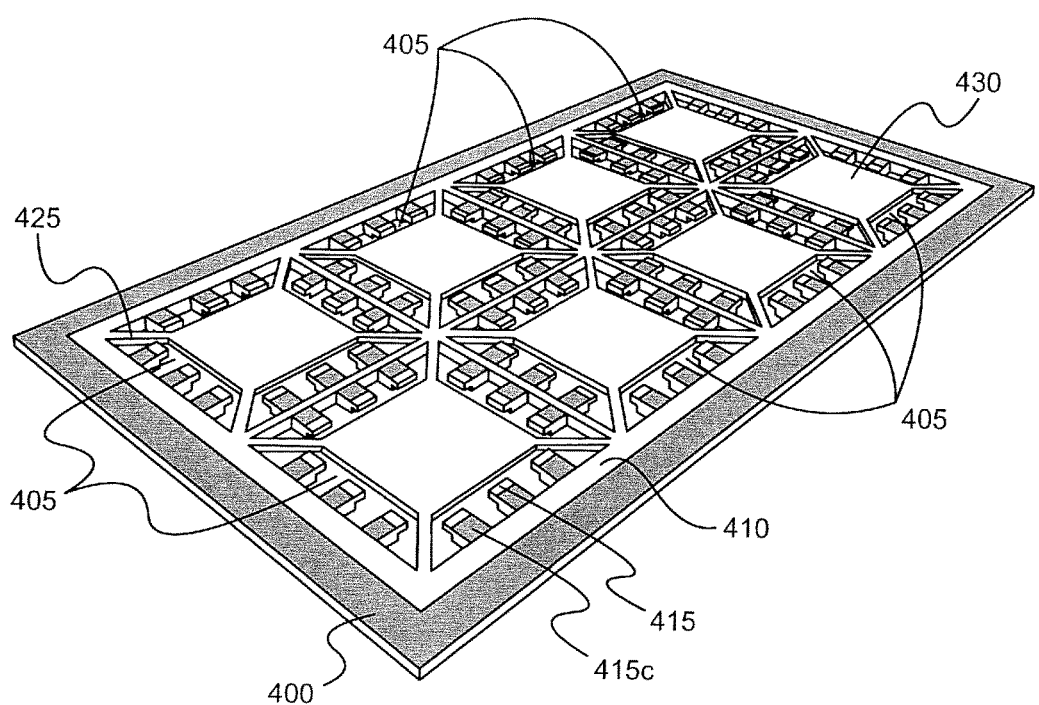
Figure 4B:
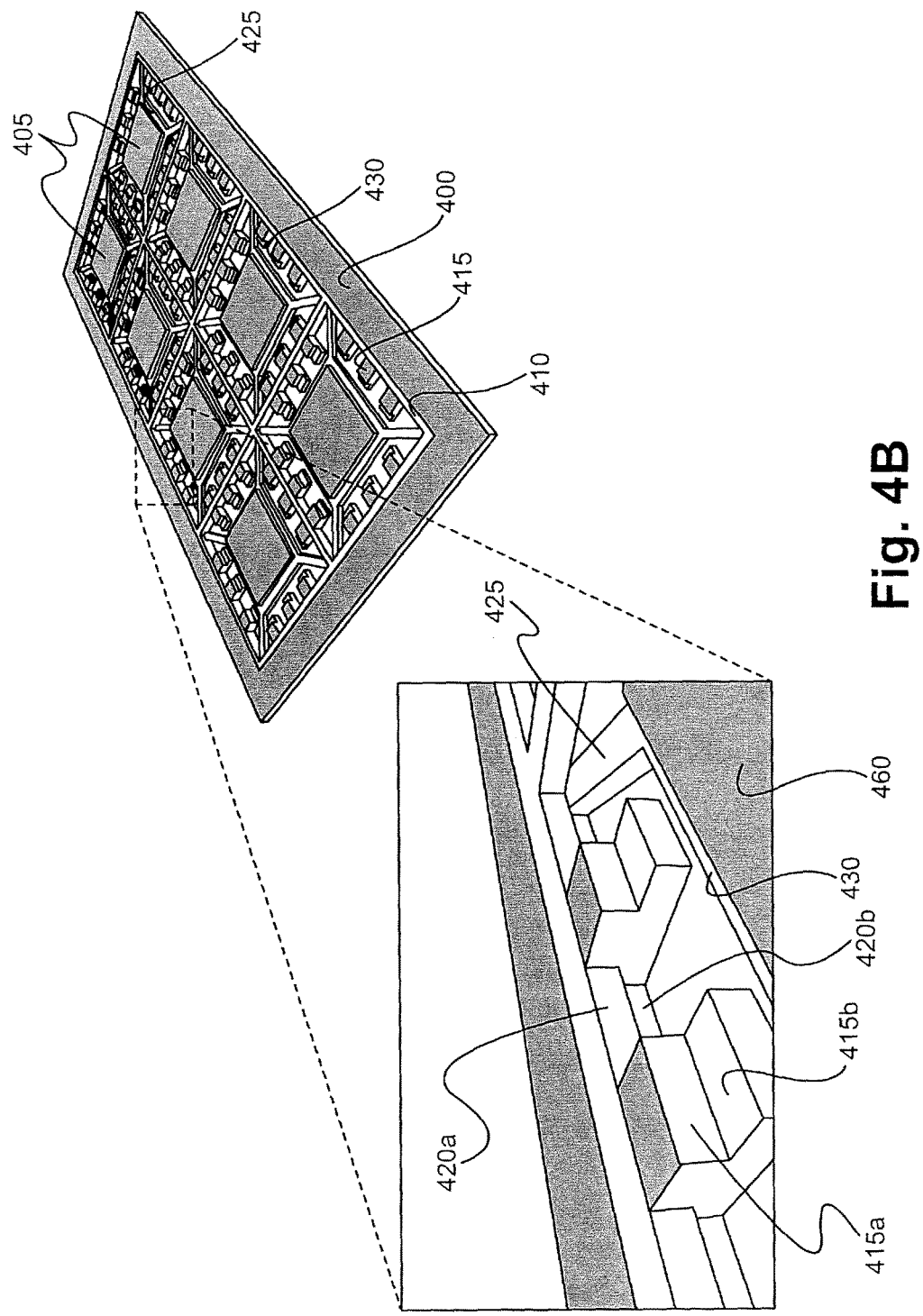

FIG. 3 illustrates an exemplary method 300 of manufacturing semiconductor packages according to some embodiments. An exemplary result produced by each step of the method 300 is illustrated in FIGS. 4A-4K. The method 300 begins at a Step 305, where an etched leadframe strip 400 is obtained. In some embodiments, the etched leadframe strip 400 is made of copper. FIG. 4A illustrates the frontside (or top side) of the leadframe strip 400, while FIG. 4B illustrates the backside (or bottom side or contact side) of the leadframe strip 400. The leadframe strip 400 includes an array of device areas 405. Although the leadframe strip 400 is shown to include a 3×2 array of device areas 405, the array of device areas can be bigger or smaller.

Figure 7:
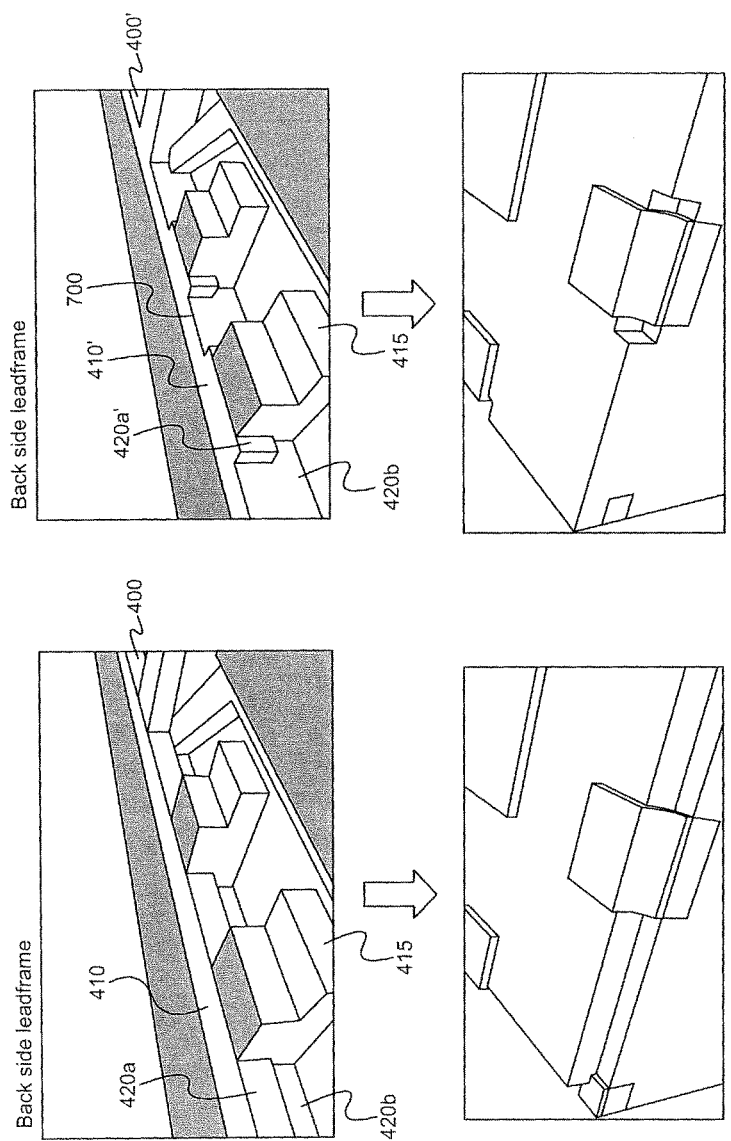
FIG. 7A illustrates a graphical explanation of how a step portion of a molding compound is shaped according to some embodiments
FIG. 7B illustrates a graphical explanation of how an alternate step portion of a molding compound is shaped according to some embodiments.

Each device area 405 includes dam bars 410 and contacts 415 coupled with the dam bars 410. The dam bars 410 enclose a corresponding device area 405. Each dam bar 410 includes a step 420 that is formed by an extruding portion 420a and a non-extruding portion 420b. As discussed elsewhere, the step 420 can continuously run or discretely run (as illustrated in FIG. 7B) the full length of a corresponding dam bar 405. The extruding portion 420a of the step 420 protrudes towards the center of the corresponding device area 405. As will become apparent, the extruding portion 420a and the non-extruding portion 420b will form a step portion in a molding compound around the contacts 415.

Each of the contacts 415 includes a first portion 415a that is coupled with the extruding portion 420a of the step 420, and a second portion 415b that is coupled with the non-extruding portion 420b of the step 420. In some embodiments, the second portion 415b extends further towards the center of the corresponding device area 405 than the first portion 415a does. Alternatively, the first portion 415a extends further towards the center of the corresponding device area 405 than the second portion 415b does. The different sizes of the first portion 415a and the second portion 415b act as a locking mechanism with the molding compound. Alternatively, edges of both the first portion 415a and the second portion 415b extending towards the center of the corresponding device area 405 are flush.

In some embodiments, the corresponding device area 405 further includes tie bars 425 and a die attach pad 430 coupled with the tie bars 425 such that the die attach pad 430 is suspended to the leadframe strip 400 in the corresponding device area 405 via the tie bars 425. In some embodiments, the tie bars 425 are coupled with the non-extruding portion 420b of the step 420.

At a Step 310, different areas of the etched leadframe strip 400 are plated. The different areas of the leadframe strip 400 include areas on the backside of the leadframe strip 400 and areas on the frontside of the leadframe strip 400. On the backside of the leadframe strip 400, the first portions 415a of the contacts 415, the die attach pads 430 and a portion of the perimeter of the leadframe strip 400 are plated. On the frontside of the leadframe strip 400, areas 415c of the second portions 415b of the contacts 415 and a portion of the perimeter of the leadframe strip 400 are plated. These area 415c of the second portions 415b of the contacts 415 are where semiconductor dice are electrically coupled with. In FIG. 4A, the area 415c of the second portions 415b abut the dam bars 410. The plated areas on the backside and the frontside of the leadframe strip 400 will act as a chemical etching mask; as such, unplated areas will be etched away in a later etching step (e.g., Step 325). The plating material 460 can be Ag, Cu, NiPdAu, or other suitable material.

Figure 4C:
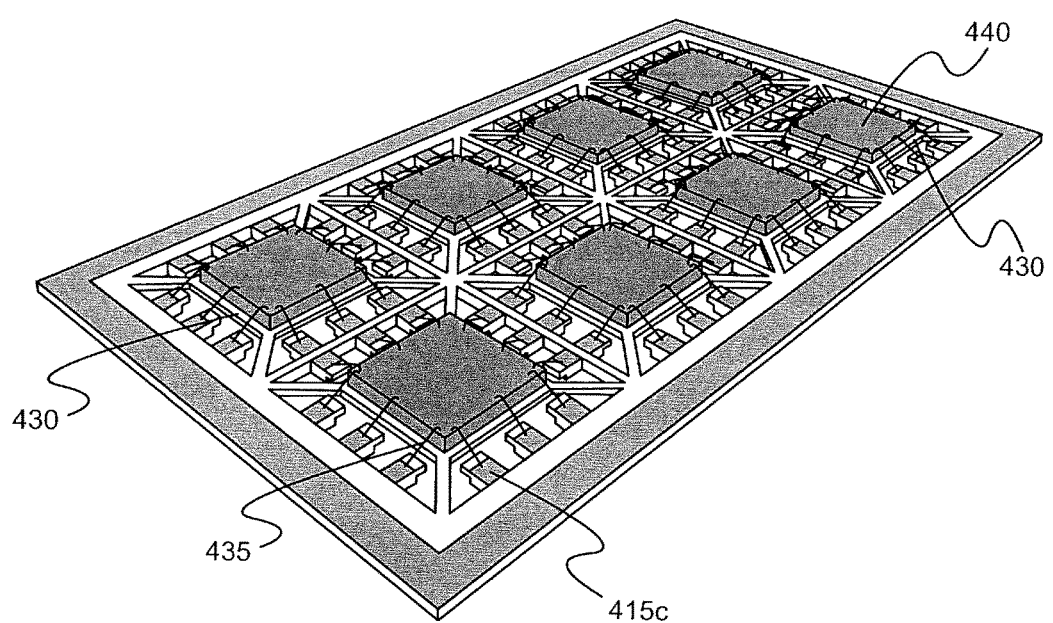

At a Step 315, a plurality of semiconductor dice 440 is electrically coupled with the plurality of contacts. Each device area 415 includes at least one semiconductor die 440. In some embodiments, as illustrated in FIG. 4C, on the frontside of the leadframe strip 400, epoxy is applied between the die attach pads 430 and the semiconductor dice 440, and wirebonds couple the semiconductor dice 440 with the area 415c of the second portions 415 of the contacts 415. Alternatively, on the frontside of the leadframe strip 400, the semiconductor dice 440 are flipped and positioned so that solder balls couple the semiconductor dice 440 with the area 415c of the second portions 415 of the contacts 415.

Figure 4D:
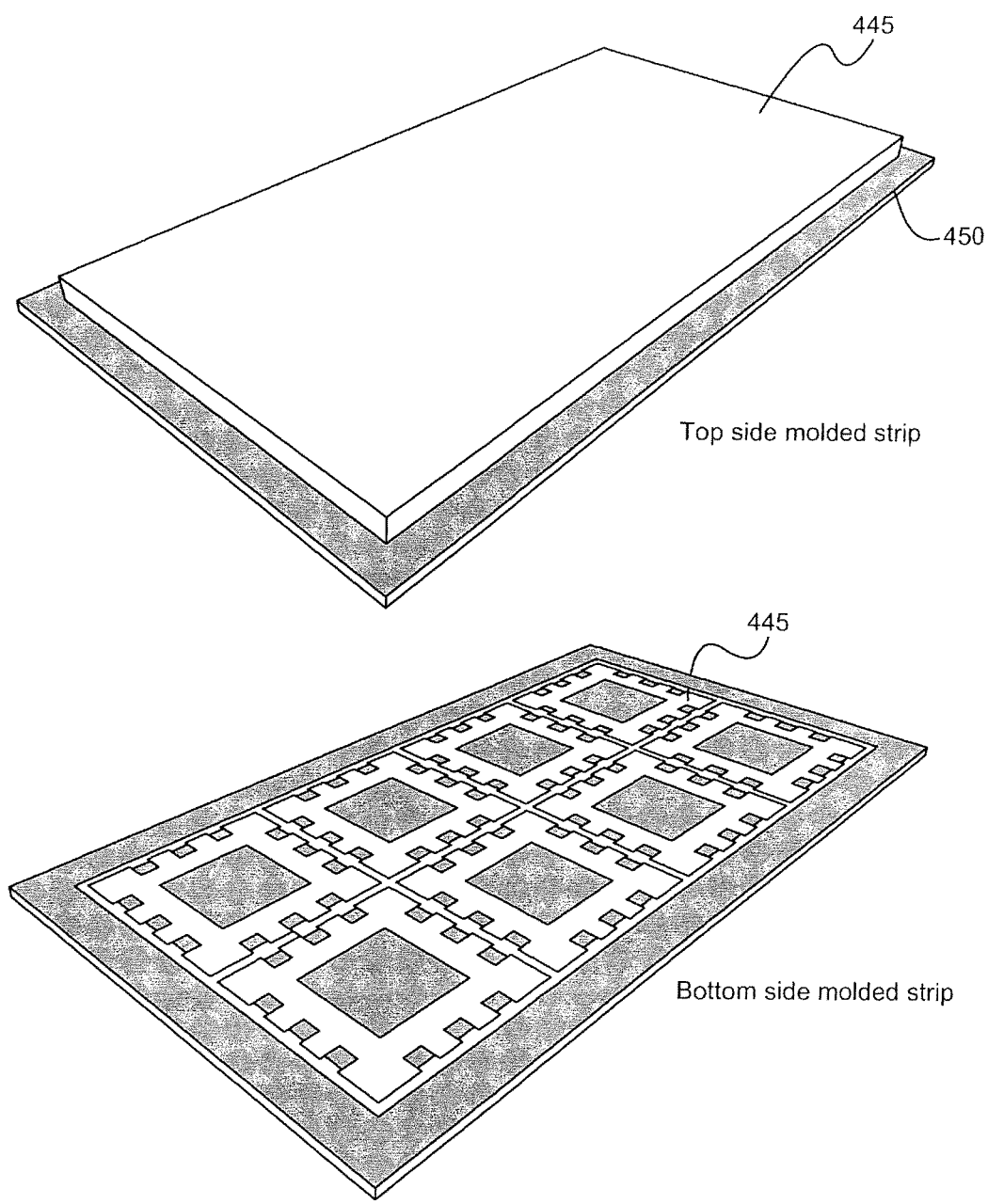

At a Step 320, the plurality of semiconductor dice 440 is encapsulated with a molding compound 445, resulting in a molded leadframe strip 450. FIG. 4D illustrates the top side of the molded leadframe strip 450 and the bottom side of the molded leadframe strip 450.

Figure 4F:
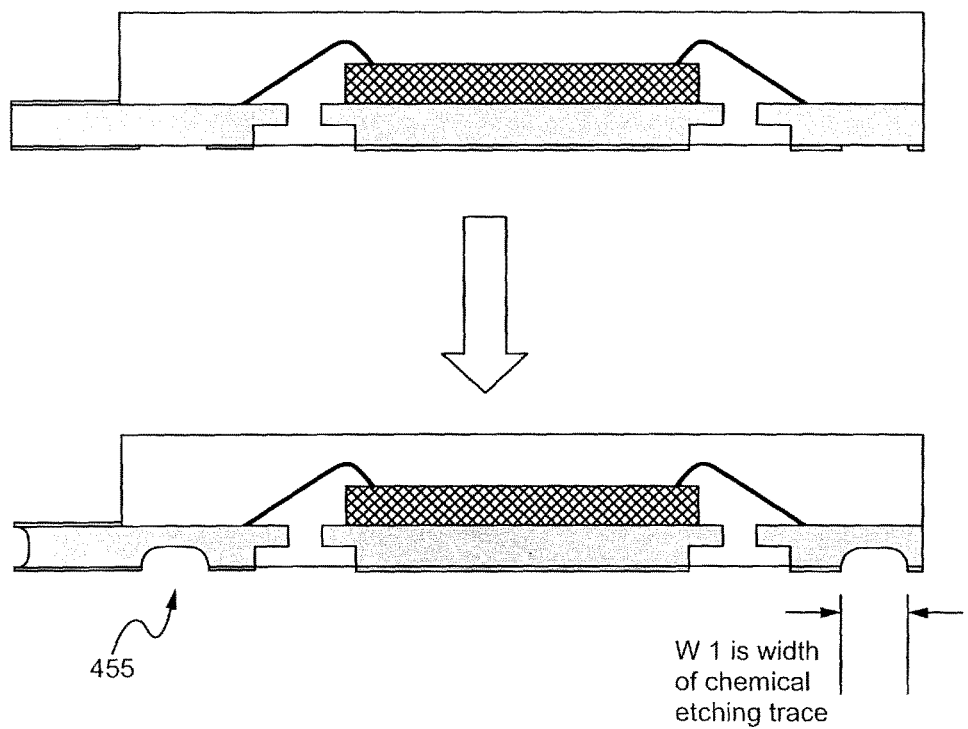

At a Step 325, at least a portion of the molded leadframe strip 450 is removed, thereby creating etching traces 455. A chemical etching process, such as a copper chemical etching dip process or a copper chemical etching spray process of FIG. 4E, is applied to remove exposed copper portions of the molded leadframe strip 450 that were not plated at the Step 310. The degree of etching is not a full etch/cut. Instead, in some embodiments, the degree of etching is a half etch (e.g., etch to half the thickness of the leadframe strip 400). More or less etching is contemplated, depending on application. It is important not to fully etch in order for it to carry electricity in a later electric plating step (e.g., Step 335). The chemical etching process creates the chemical etching traces 455 along the unplated areas at the bottom of the molded leadframe strip 450. FIG. 4F illustrates a cross sectional view of the molded leadframe strip 450 before the Step 325 and a cross sectional view of the molded leadframe strip 450 after the Step 325. The chemical etching traces 455 are shown in the cross sectional view of the molded leadframe strip 450. In some embodiments, the corners of the chemical etching traces 455 are curved.

Figure 4G:
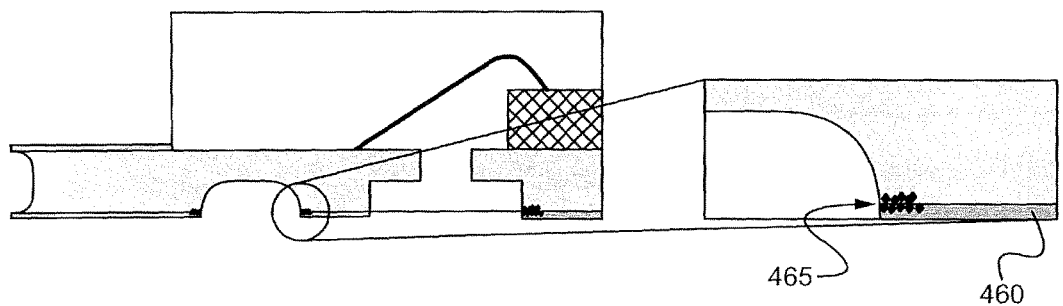
Figure 4H:
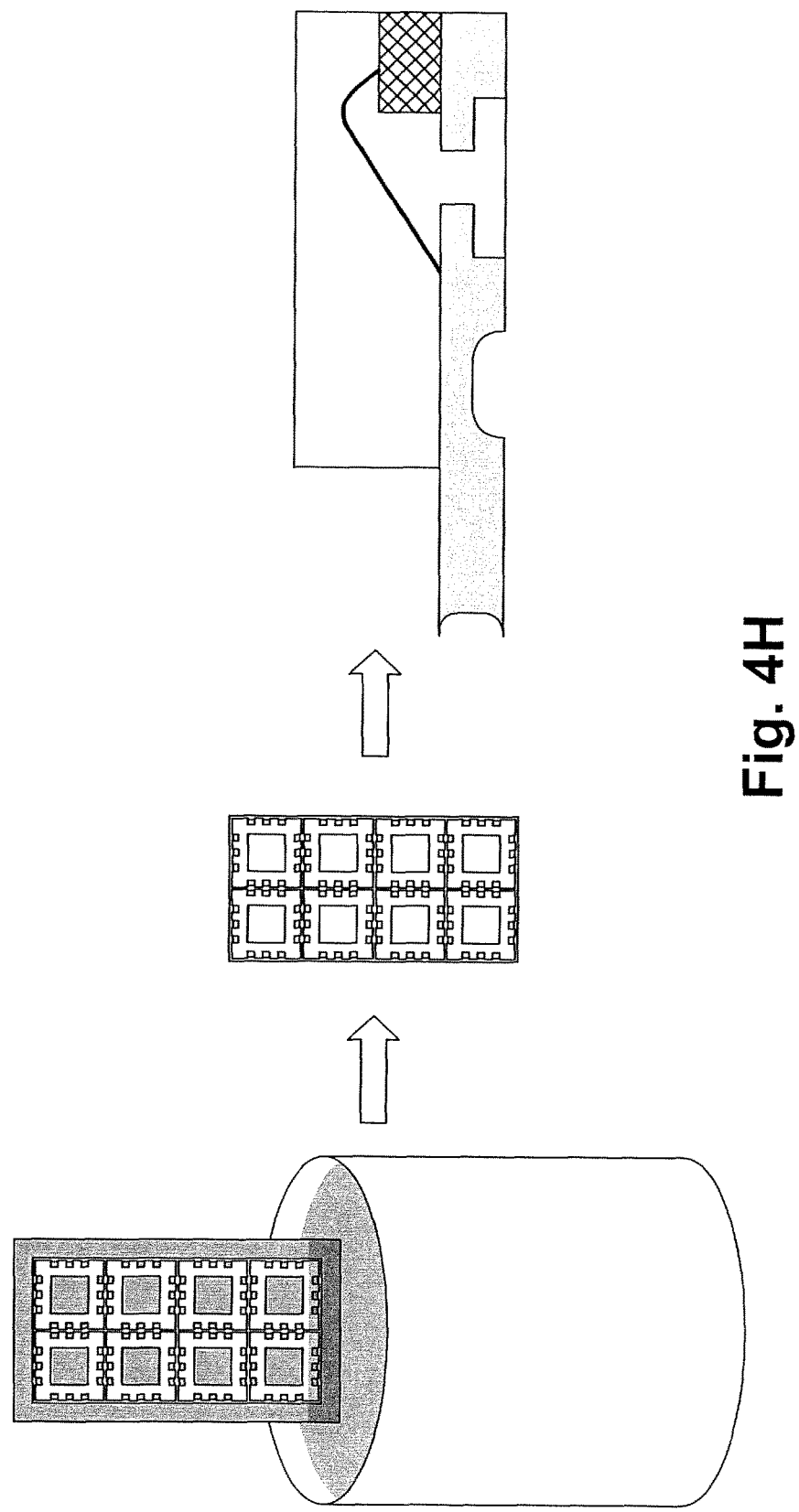

The chemical etching process can result in one or more "weak points" 465 between the metal plating 460 and the copper base material of the molded leadframe strip 450, as illustrated in FIG. 4G. To avoid the isotropic etching effect, at a Step 330, the metal plating 460 of the molded leadframe strip 450 are removed via, for example, a dip process, as illustrated in FIG. 4H to reveal exposed areas of the molded leadframe 450. Other strip off procedures are contemplated.

Figure 4I:
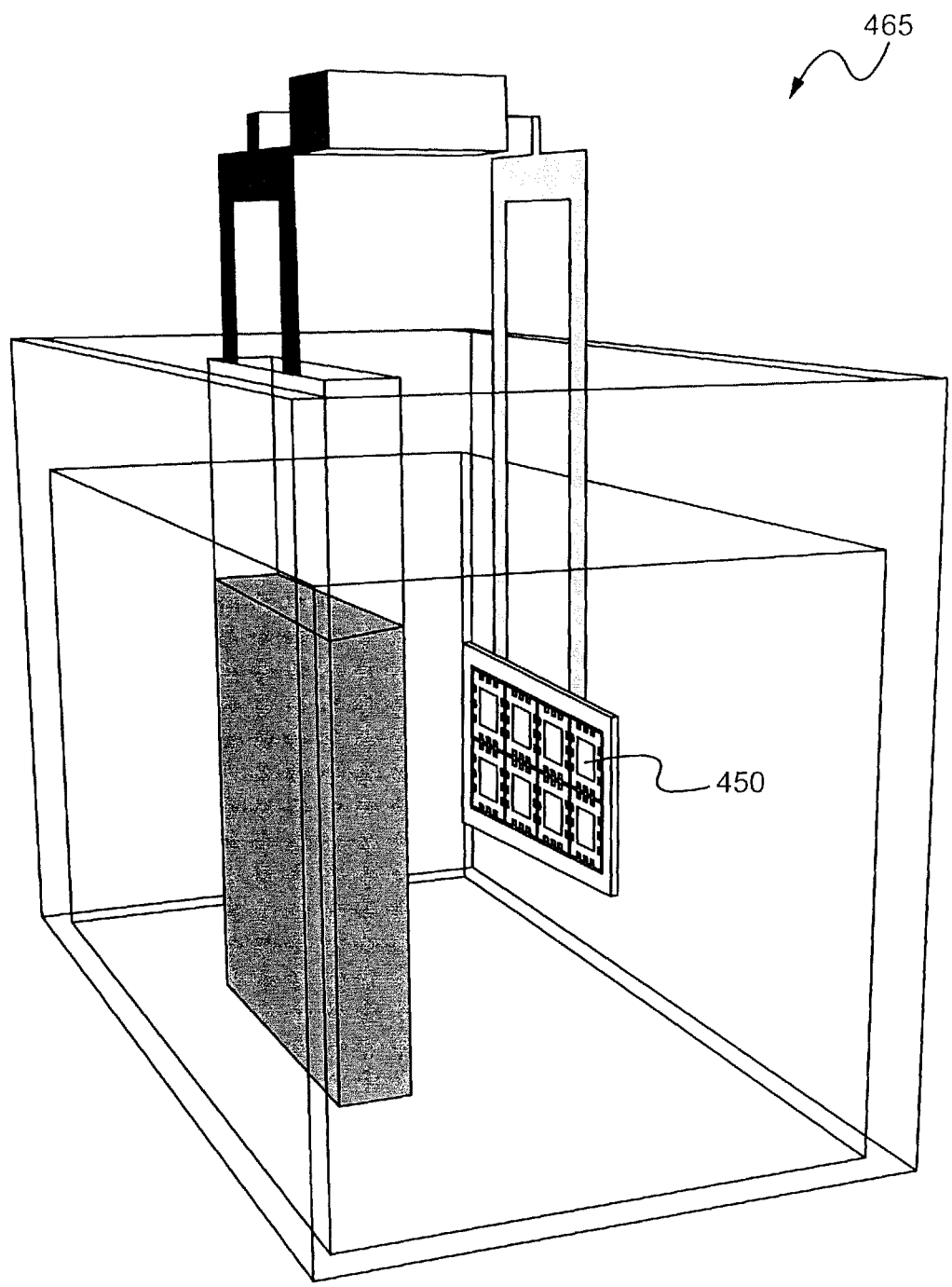
Figure 4J:
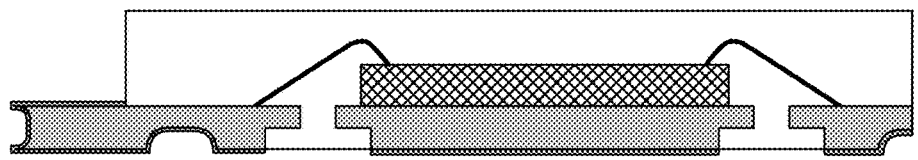

At a Step 335, the exposed areas of the molded leadframe strip 450 are plated. Particularly, the molded leadframe strip 450 is plated with a plating material can be Sn or other suitable material on the exposed copper, including the chemical etching traces 455, of the molded leadframe 450 in order to prevent surface reaction with oxygen. In some embodiments, an electric plating process is used. FIG. 4I illustrates an exemplary electric plating machine 465. The molded leadframe 450 is held at a cathode terminal of the electric plating machine 465, while the plating material is located in a basket at an anode terminal. Both the molded leadframe 450 and the plating material are immersed in a plating solution that is in a plating tank. When an electrical power source is operating in the plating tank, an electrical current brings particles of the plating material from the anode terminal to the cathode terminal via the plating solution. Because the molded leadframe 450 is held at the cathode terminal, the plating particles which come along with the electrical current are plated on the metal surfaces of the molded leadframe 450. FIG. 4J illustrates a cross sectional view of the molded leadframe 450 after the Step 335. The new plating material is plated on the exposed copper, including the chemical etching traces 455, of the molded leadframe 450.

Figure 4K:
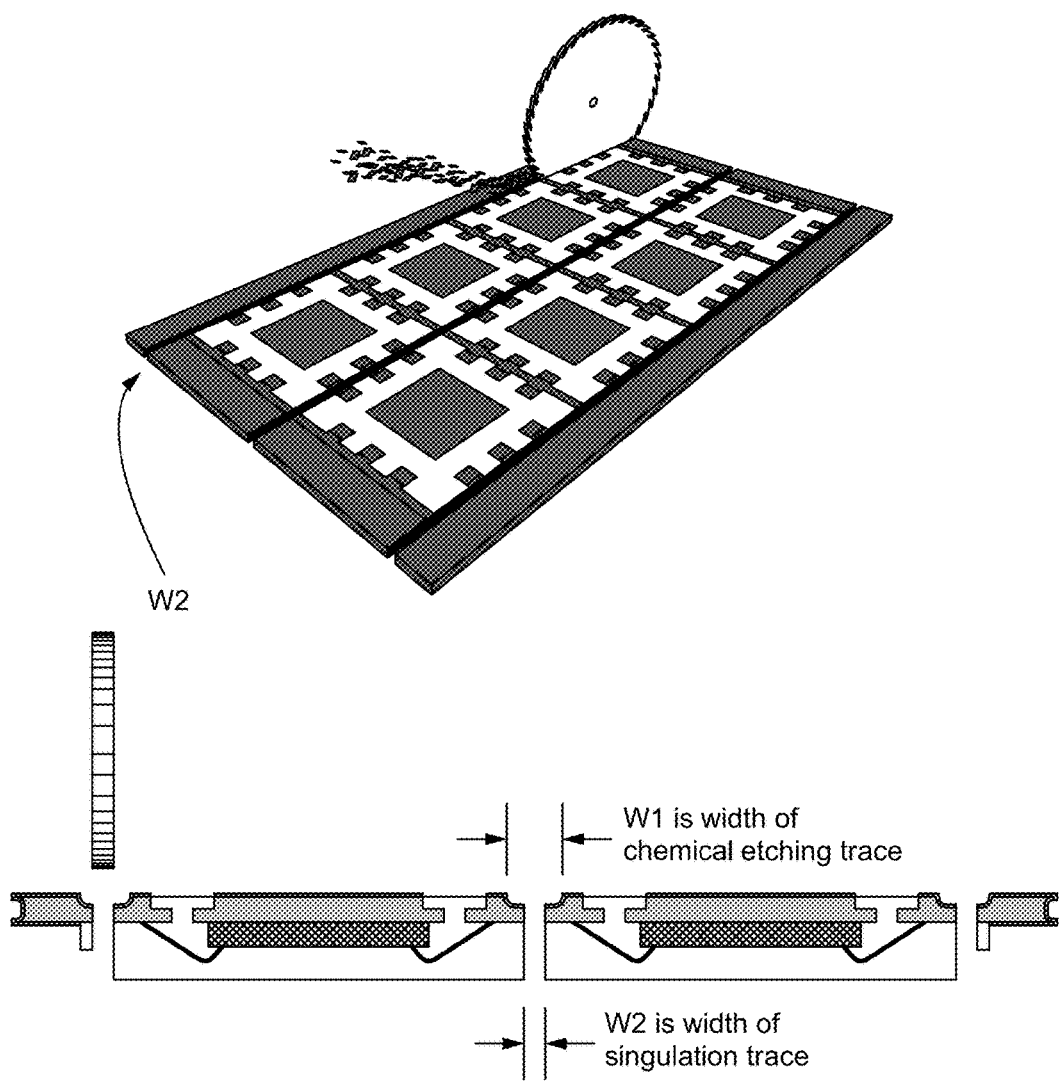

At a Step 340, each of the semiconductor packages is singulated, along singulation traces, from other semiconductor packages. In some embodiments, the singulation uses a saw or blade, as illustrated in FIG. 4K. The thickness of the blade is narrower than the width of the chemical etching traces 455. In some embodiments, the molded leadframe 450 is singulated at the center location of the chemical etching traces 455. As such, the width of each of the singulation traces is less than the width of each of the etching traces. The method 300 results in singulated semiconductor packages.

Figure 5A:
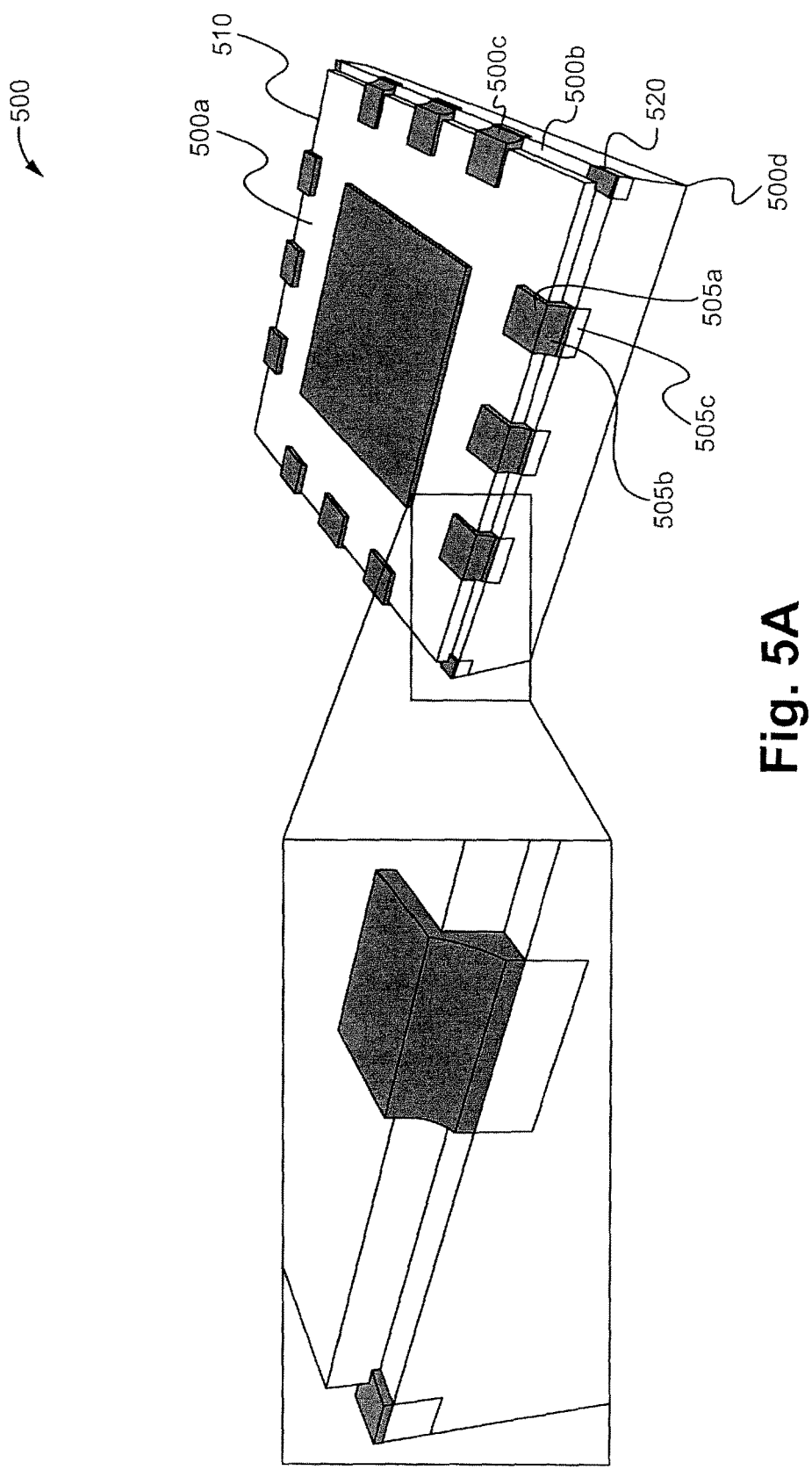
FIGS. 5A-5B illustrate a singulated semiconductor package according to some embodiments.
Figure 5B:
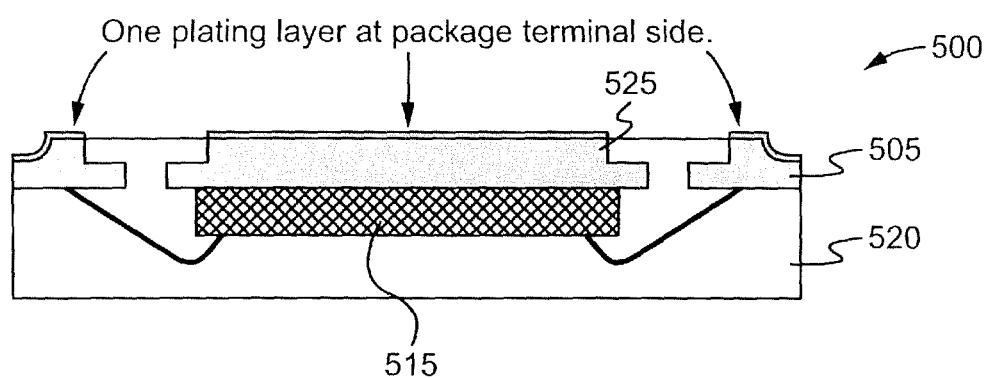
Figure 6:
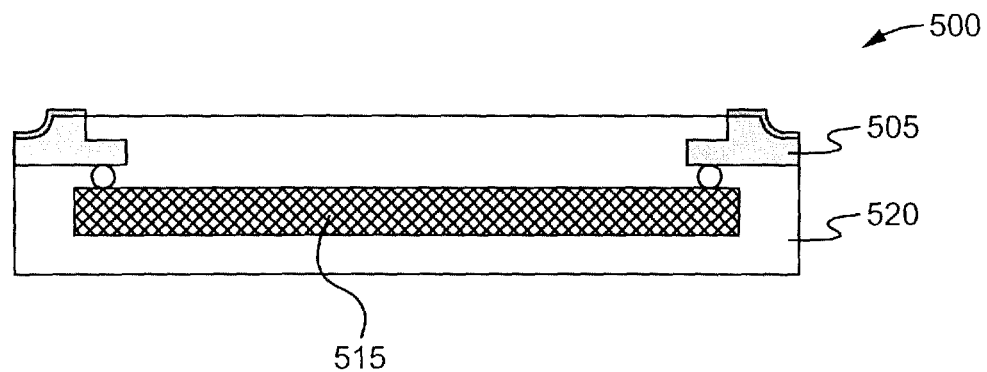
FIG. 6 illustrates another singulated semiconductor package according to some embodiments.

FIGS. 5A-5B illustrate a singulated semiconductor package 500 according to some embodiments. In particular, FIG. 5A illustrates a perspective view of the singulated semiconductor package 500 and FIG. 5B illustrates a cross sectional view of the singulated semiconductor package 500. After singulation, the semiconductor package 500 includes a formed leadframe that includes a plurality of contacts 505. The plurality of contacts 505 is located around peripheral edges 510 of the singulated semiconductor package 500. Side surfaces of each of the plurality of contacts 505 are partially plated. A semiconductor die 515 is electrically coupled with the plurality of contacts 505. In some embodiments, the formed leadframe also includes tie bars and a die attach pad 525 that is coupled with the tie bars. In FIG. 5B, the semiconductor die 515 is epoxied with the die attach pad 525 and is electrically coupled with the plurality of contacts 505 using wirebonds. Alternatively, instead of wirebonds, solder balls are used to electrically couple the semiconductor die with the plurality of contacts, as illustrated in FIG. 6. Although a single semiconductor die 515 is described, it is contemplated that a singulated semiconductor device can include a plurality of semiconductor dice stacked therein and electrically coupled with each other and/or the plurality of contacts 505. Each of the plurality of contacts 505 includes an interfacing surface at a bottom of the singulated semiconductor package 500, an interior surface that is opposite the interfacing surface, a step at a non-exposed end that is positioned near the semiconductor die 515 and a curved corner at an exposed end (e.g., side surface) that is opposite the non-exposed end, such that the area of the exposed surface of the contact 505 is smaller than the area of the interior surface of the contact 505.

Referring back to FIGS. 5A-5B, the singulated semiconductor package 500 includes a molding compound 520 that encapsulates the semiconductor die 515. The molding compound 520 also encapsulates at least a portion of the die attach pad 525 such that the die attach pad 525 is exposed and flush with a bottom surface 500a of the semiconductor package 500. The molding compound 520 further encapsulates at least a portion of each of the plurality of contacts 505 such that a first surface 505a of a corresponding contact 505 is flush with the bottom surface 500a of the semiconductor package 500, a second surface 505c of the corresponding contact 505 is flush with a side surface 500c of the semiconductor package 500, and a curved surface 505b of the corresponding contact 505 is located at a step 500b of the side surface 500c of the semiconductor package 500. The die attach pad 525 exposed at the bottom surface 500a of the semiconductor package 500, and the first surfaces 505a and the curved surfaces 505b of the plurality of contacts 505 are plated via a single plating step (the Step 335 of FIG. 3). However, the second surfaces 505c of the plurality of contacts 505 are not plated. In particular, as the result of singulation (the Step 340 of FIG. 3), the second surfaces 505c (the "upright" surfaces) of the plurality of contacts 505 are exposed copper at the sides 500c of the semiconductor package 500. Each side (the curved surface 505b and the second surface 505c, collectively) of the plurality of contacts 505 is thus partially plated.

The curved surfaces 505b of the plurality of contacts 505 are concave, as the result of the Steps 325-335 of FIG. 3 (e.g., copper chemical etching to Sn plating steps). In some embodiments, because the degree of etching at the Step 325 of FIG. 3 is a half etch, the height of the curved surfaces 505b is half the height of the contacts 505. As explained elsewhere, a step portion of the molding compound 520 (the step 500b of the semiconductor package along/on one edge/side of the semiconductor package) will assist in the visual inspection for proper solder coverage on the sides of the plurality of contacts 505 when the semiconductor package 500 is reflowed on a PCB. Because of the step portion of the molding compound 520, the area of the bottom surface 500a of the semiconductor package 500 is smaller than the area of a top surface 500d of the semiconductor package 500.

FIG. 7A illustrates a graphical explanation of how a step portion of a molding compound is shaped according to some embodiments. In FIG. 7A, the step portion of the molding compound continuously runs the full package length. As discussed above, regarding FIG. 4B, each dam bar 410 includes the step 420 that is formed by the extruding portion 420a and the non-extruding portion 420b. The step 420 continuously runs the full length of a corresponding dam bar 410. The step 420 of the leadframe strip 400 shapes the step portion of the molding compound. The unplated step 420 of the leadframe strip 400 is removed during the copper chemical etching process (the Step 325 of FIG. 3), which results in the step portion of the molding compound being "full."

FIG. 7B illustrates a graphical explanation of how an alternate step portion of a molding compound is shaped according to some embodiments. In FIG. 7B, the step portion of the molding compound discretely runs the full package length at locations of the plurality of contacts. Each dam bar 410' includes a step 420' that is formed by an extruding portion 420a' and a non-extruding portion 420b. The step 420' discretely runs the full length of a corresponding dam bar 410' such that there are gaps 700 in the step 420' between the plurality of contacts 415. The step 420' of the leadframe strip 400' shapes the step portion of the molding compound. The unplated step 420' of the leadframe strip 400' is removed during the copper chemical etching process (the Step 325 of FIG. 3), which results in the step portion of the molding compound being "partial," with a part of the step portion at each of the plurality of contacts 415.

Figure 8:
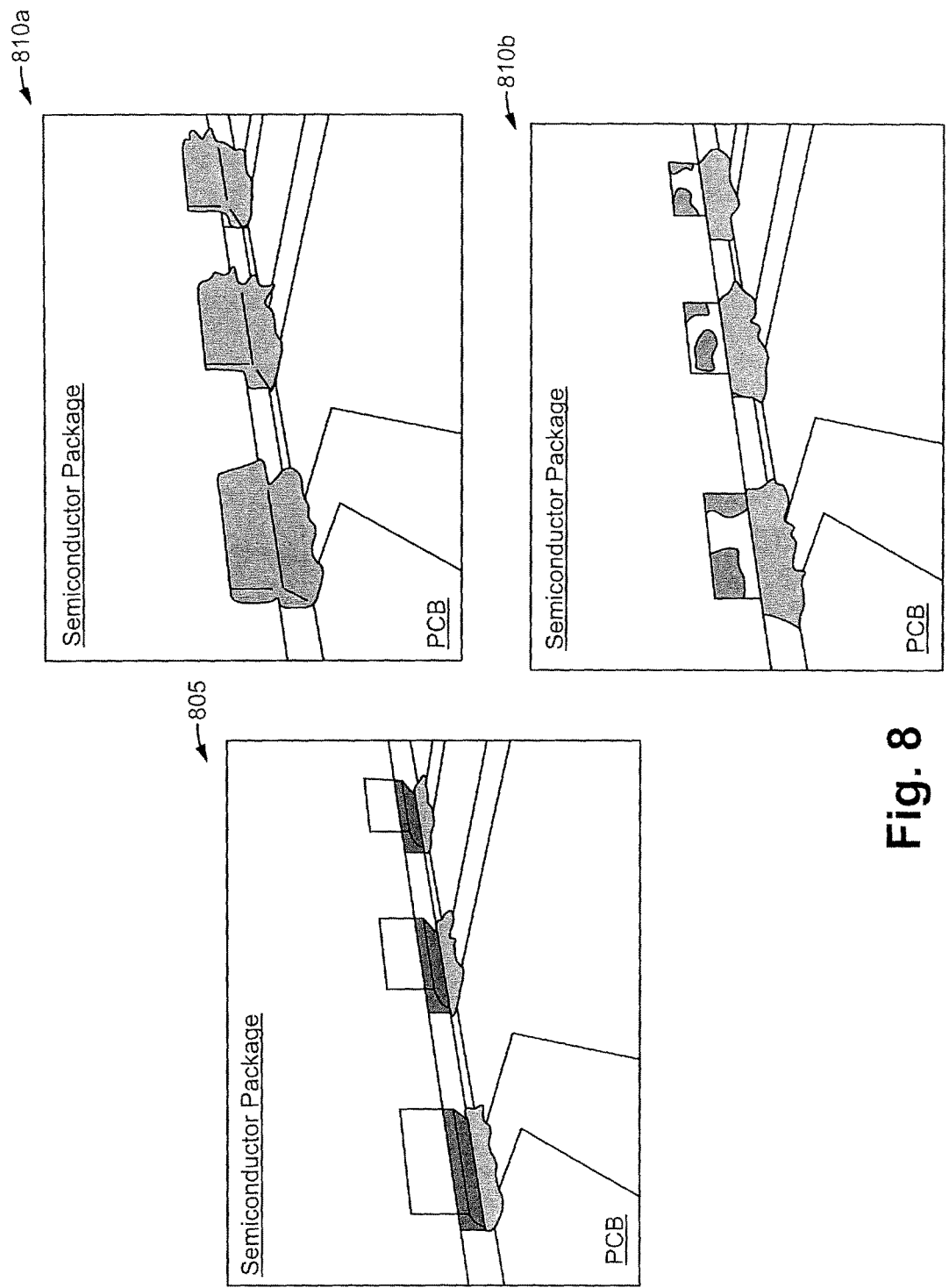
FIG. 8 illustrates a graphical explanation of an application according to some embodiments.

FIG. 8 illustrates a graphical explanation of an application according to some embodiments. The picture 805 on the left shows a semiconductor package, such as the semiconductor package 500, on a PCB before reflow. Solder is applied between the plurality of contacts and PCB. After reflow, one of two results can happen. One result, shown in the picture 810a on the top right, if the exposed copper surfaces of the plurality of contacts are not contaminated, the solder can cover the entire side surfaces of the plurality of contacts during soldering. Another result, shown in the picture 810b on the bottom right, if the copper surfaces of the plurality of contacts are contaminated, the solder can still partially cover the side surfaces of the plurality of contacts, particularly the areas of the side surfaces that are plated, during soldering. In both of these results, reliability of solder joint is good and can be determined as such by visual inspection.

As demonstrated herein, there is no additional processing step that is required to partially plated contact side surfaces. These partially plated contact side surfaces are plated at the same time as other areas (such as the first surfaces of the contacts and, in some embodiments, the die attach pad) are plated. There is only one plating layer that is applied to the semiconductor package. The semiconductor package with partial plating on its contact side surfaces ensures quality of soldering of the semiconductor package to a substrate. It should be noted that any combination of features (e.g., contacts, dimples, dies, die attach pads, solder balls, bond wires, etc.) can be used as required for the desired package One of ordinary skill in the art will realize other uses and advantages also exist. While the invention has been described with reference to numerous specific details, one of ordinary skill in the art will recognize that the invention can be embodied in other specific forms without departing from the spirit of the invention. Thus, one of ordinary skill in the art will understand that the invention is not to be limited by the foregoing illustrative details, but rather is to be defined by the appended claims.

We claim:

1. A semiconductor package comprising:
   a semiconductor die;
   a formed leadframe having a plurality of contacts, each including an interfacing surface at a bottom of the semiconductor package, an interior surface that is opposite the interfacing surface, a contact step at a non-exposed end that is positioned near the semiconductor die and that is formed by the interior surface extending further towards the semiconductor die than the interfacing surface, and a curved corner at an exposed end that is opposite the non-exposed end, such that the area of the interfacing surface is smaller than the area of the interior surface; and
   a molding compound encapsulating the semiconductor die and at least a portion of each of the plurality of contacts, wherein the molding compound includes an encapsulant step that discretely runs the full length of an edge of the semiconductor package, and wherein the curved corner of the contact is located at the encapsulant step, wherein the width of the encapsulant step along the edge of the semiconductor package is larger than the width of the contact located at the encapsulant step.

2. The semiconductor package of claim 1, wherein, at a back side of the semiconductor package, the interfacing surface of the contact is plated.

3. The semiconductor package of claim 2, wherein, at the back side of the semiconductor package, a first portion of the exposed end is plated and a second portion of the exposed end is not plated, wherein the first portion is the curved corner of the contact.

4. The semiconductor package of claim 3, wherein the formed leadframe further includes:
   tie bars; and
   die attach pad coupled with the tie bars.

5. The semiconductor package of claim 4, wherein, at the back side of the semiconductor package, the die attach pad is also plated.

6. The semiconductor package of claim 3, wherein the semiconductor die is electrically coupled with the interior surface of the contact via wirebonds.

7. The semiconductor package of claim 3, wherein the semiconductor die is electrically coupled with the interior surface of the contact via solder balls.

8. A semiconductor package comprising:
   a plurality of contacts located around peripheral edges of the semiconductor package, wherein side surfaces of each of the plurality of contacts are partially plated;
   a semiconductor die electrically coupled with the plurality of contacts; and
   a molding compound encapsulating the semiconductor die and at least a portion of each of the plurality of contacts such that a first surface of a corresponding contact is flush with a bottom surface of the semiconductor package, a curved surface of the corresponding contact is located at a step along an edge of the semiconductor package, and a second surface of the corresponding contact is flush with a side surface of the semiconductor package and extends beyond the depth of the step, wherein the width of the step along the edge of the semiconductor package is larger than the width of the corresponding contact located at the step.

9. The semiconductor package of claim 8, wherein the first surfaces and the curved surfaces of the plurality of contacts are plated but the second surfaces of the plurality of contacts are not plated.

10. The semiconductor package of claim 8, wherein the area of the bottom surface of the semiconductor package is smaller than the area of a top surface of the semiconductor package.

11. The semiconductor package of claim 10, further comprising a die attach pad, wherein the molding compound encapsulates at least a portion of the die attach pad such that the die attach pad is exposed and flush with the bottom surface of the semiconductor package.

12. The semiconductor package of claim 11, wherein the die attach pad exposed at the bottom surface of the semiconductor package is plated.

13. The semiconductor package of claim 10, further comprising another semiconductor die that is encapsulated in the molding compound.

14. The semiconductor package of claim 8, wherein the step continuously runs the full length of the side surface of the semiconductor package.

15. The semiconductor package of claim 8, wherein the step discretely runs the full length of the side surface of the semiconductor package.

16. A semiconductor package comprising:
   a semiconductor die;
   a formed leadframe having a plurality of contacts, each including an interfacing surface at a bottom of the semiconductor package, an interior surface that is opposite the interfacing surface, a contact step at a non-exposed end that is positioned near the semiconductor die and that is formed by the interior surface extending further towards the semiconductor die than the interfacing surface, and a curved corner at an exposed end that is opposite the non-exposed end; and
   a molding compound encapsulating the semiconductor die and at least a portion of each of the plurality of contacts, wherein the molding compound includes an encapsulant step that is along an edge of the semiconductor package, and wherein the curved corner of the contact is located at the encapsulant step, wherein the width of the encapsulant step along the edge of the semiconductor package is larger than the width of the contact located at the encapsulant step.

17. The semiconductor package of claim 16, further comprising a continuous plating layer of the same thickness directly adhered to the interfacing surface and the curved corner of each of the plurality of contacts.

18. The semiconductor package of claim 17, further comprising a die attach pad and a continuous plating layer of the same thickness directly adhered to an exposed surface of the die attach pad, wherein the plating layer that is directly adhered to the exposed surface of the die attach pad is the same thickness as the plating layer that is directly adhered to the curved corner.

19. The semiconductor package of claim 18, wherein the forming leadframe further includes:
   tie bars, wherein two portions of each of the tie bars are exposed at two adjacent side surfaces of the semiconductor package, wherein the two portions are not plated; and die attach pad coupled with the tie bars.

20. The semiconductor package of claim 19, wherein another portion of each of the tie bars is exposed at the step along the edge of the semiconductor package, wherein the another portion is plated.

\* \* \* \* \*